United States Patent

Shiraishi

[11] Patent Number: 5,638,211
[45] Date of Patent: Jun. 10, 1997

[54] METHOD AND APPARATUS FOR INCREASING THE RESOLUTION POWER OF PROJECTION LITHOGRAPHY EXPOSURE SYSTEM

[75] Inventor: Naomasa Shiraishi, Urawa, Japan

[73] Assignee: Nikon Corporation, Shinagawa, Japan

[21] Appl. No.: 257,956

[22] Filed: Jun. 10, 1994

Related U.S. Application Data

[63] Continuation of Ser. No. 101,674, Aug. 4, 1993, abandoned, which is a continuation of Ser. No. 847,030, filed as PCT/JP91/01103, Aug. 19, 1991, abandoned.

[30] Foreign Application Priority Data

Aug. 21, 1990 [JP] Japan .................. 2-218030

[51] Int. Cl.$^6$ .................. G02B 27/46; G02B 5/18; G02B 27/44; G03B 27/42
[52] U.S. Cl. .................. 359/559; 359/558; 359/562; 359/563; 355/53
[58] Field of Search .................. 359/558, 559, 359/562, 564; 250/237 R, 550; 355/53

[56] References Cited

U.S. PATENT DOCUMENTS

| | | | |
|---|---|---|---|
| 3,492,635 | 1/1970 | Farr | 359/559 |
| 3,639,039 | 2/1972 | Rhodes, Jr. | 359/559 |
| 3,658,420 | 4/1972 | Axelrod | 359/558 |
| 3,729,252 | 4/1973 | Nelson . | |
| 4,472,023 | 9/1984 | Yamamoto | 359/562 |
| 4,854,669 | 8/1989 | Birnbach et al. | 359/559 |
| 4,947,413 | 8/1990 | Jewell et al. . | |
| 5,004,348 | 4/1991 | Magome | 356/401 |

FOREIGN PATENT DOCUMENTS

| | | |
|---|---|---|
| 59-83165 | 5/1984 | Japan . |
| 61-41150 | 2/1986 | Japan . |
| 61-91662 | 5/1986 | Japan . |
| 250417 | 2/1990 | Japan . |

*Primary Examiner*—Paul M. Dzierzynski
*Assistant Examiner*—Audrey Chang
*Attorney, Agent, or Firm*—Oliff & Berridge

[57] ABSTRACT

A method and apparatus for transferring a fine pattern (12) on a mask (11) onto a substrate (17) by a projection exposure apparatus including an illumination optical system (1–10) for irradiating an illuminating light on the mask (11), and a projection optical system (13) for projecting an image of the fine pattern (12) on the illuminated mask onto the substrate (17). The illuminating light is irradiated at least in the form of a pair of light beams oppositely inclined with respect to the mask through a pair of transparent windows (6a, 6b) of a spatial filter (6) whereby either one of the ±first-order diffracted beams and the 0-order diffracted beam produced from the fine pattern (12) of the mask (11) illuminated by each said light beam are respectively passed apart by the equal distance from the optical axis of the projection optical system at or near to the Fourier transform plane within the projection optical system with respect to the fine pattern (12) of the mask (11), thereby forming on the substrate (17) a high-resolution projected image of a strong light-and-dark contrast with a high degree of focus depth. (FIG. 1)

19 Claims, 5 Drawing Sheets

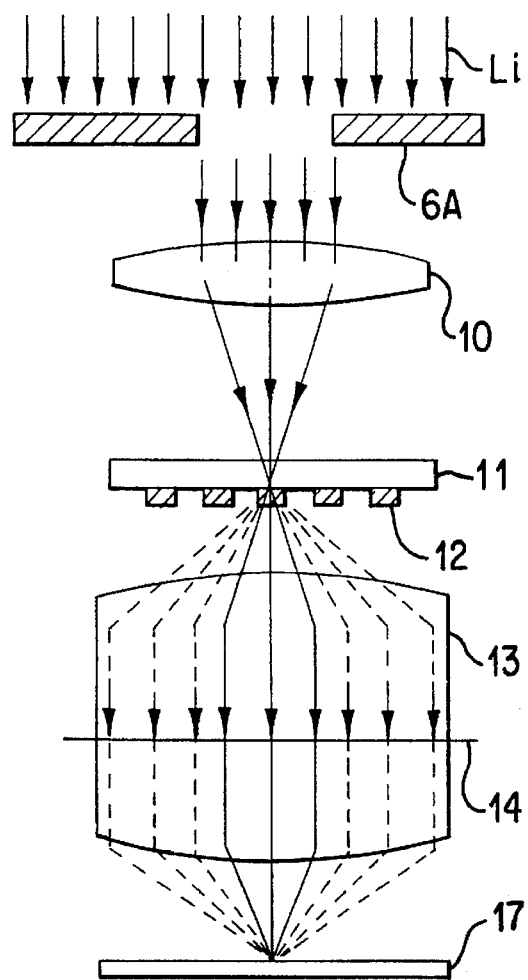
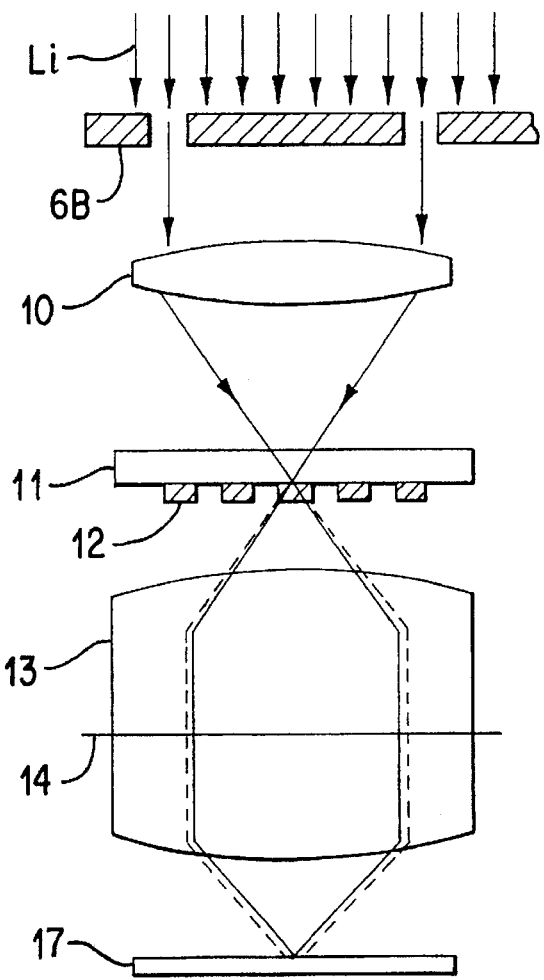
FIG. 7
(PRIOR ART)
FIG. 9
(PRIOR ART)
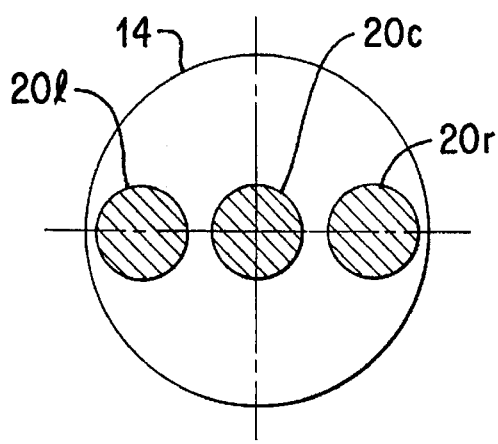
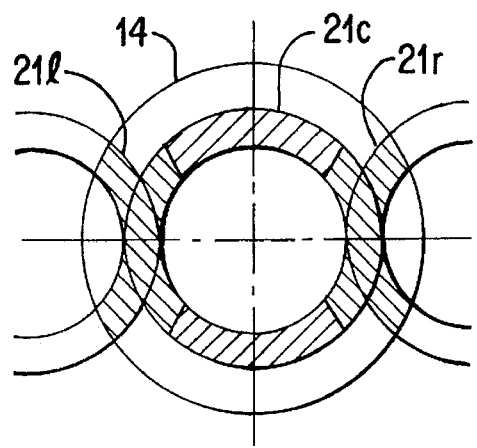
FIG. 8
(PRIOR ART)
FIG. 10
(PRIOR ART)

METHOD AND APPARATUS FOR INCREASING THE RESOLUTION POWER OF PROJECTION LITHOGRAPHY EXPOSURE SYSTEM

This application is a continuation, of application Ser. No. 08/101,674, filed Aug. 4, 1993, now abandoned which is a continuation of application Ser. No. 07/847,030, filed as PCT/JP91/01103 Aug. 19, 1991, abandoned.

TECHNICAL FIELD

The present invention relates to an exposure method and apparatus and more particularly to a projection exposure method and apparatus used in the lithographic operation for semiconductor memory devices and liquid crystal devices having regular fine patterns.

BACKGROUND ART

In the manufacture of semiconductor memory devices and liquid crystal devices by photolithographic techniques, the method of transferring a mask pattern onto a substrate has been generally used. In this case, the illuminating light for exposure purposes, e.g., ultraviolet light is irradiated on the substrate having a photosensitive resist layer formed on its surface through a mask formed with a mask pattern and thus the mask pattern is photographically transferred onto the substrate.

The common type of the fine mask patterns for semiconductor memory devices, liquid crystal devices, etc., can be considered as regular grating patterns which are vertically or laterally arranged at equal intervals. In other words, in the mask pattern of this type the most dense pattern area is formed with a grating pattern composed of equally-spaced transparent and opaque lines which are alternately arranged in the X-direction and/or the Y-direction to realize the minimum possible line width which can be formed on the substrate and the other area is formed with a pattern of a comparatively low degree of fineness. Also, in any case any oblique pattern is exceptional.

Further, the ordinary photosensitive resist material has a non-linear light response characteristic so that the application of a light quantity greater than a certain level causes chemical changes to proceed rapidly, whereas practically the chemical changes do not progress when the quantity of light received is less than this level. As a result, there is a background that with the projected image of the mask pattern on the substrate, if the difference in light quantity between the light and dark portions is ensured satisfactorily, even if the contrast of the boundary between the light and dark portions is low more or less, the desired resist image as the mask pattern can be obtained.

With the recent tendency toward finer pattern structures for semiconductor memories and liquid crystal devices, projection exposure apparatus such as a stepper for transferring a mask pattern onto a substrate by reduction projection have been used frequently and a special ultraviolet light which is shorter in wavelength and narrow in wavelengh distribution range has also come into use as an exposure illuminating light. In this case, the reason for reducing the wavelength distribution range resides in eliminating any deterioration in the image quality of a projected image due to the chromatic aberrations of the projection optical system in the exposure apparatus and the reason for selecting the shorter wavelength is to enhance the contrast of the projected image. However, the actual situation is such that this attempt of reducing the wavelength of an illuminating light has reached the limit with respect to the requirements for finer mask patterns, e.g., the projection exposure of line width of the sub-micron order due to the non-existence of any suitable light source, the restrictions to lens materials and resist materials, etc.

In the case of such a finer mask pattern, the required value for the resolution (line width) of the pattern approaches the wavelength of the illuminating light so that the effect of the diffracted light produced by the transmission of the illuminating light through the mask pattern cannot be ignored and it is difficult to ensure a satisfactory light-and-dark contrast of the projected mask pattern image on the substrate, thereby particularly deteriorating the light-and-dark contrast of the line edges of the pattern.

In other words, while the diffracted beams of the 0-order, ±first-orders, ±second-orders and higher-orders produced at various points on the mask pattern by the illuminating light incident on the mask from above are respectively reconverged at the corresponding conjugate points on the substrate for imaging through the projection optical system, the diffracted beams of the ±first-orders, ±second-orders and higher-orders are further increased in diffraction angle as compared with the diffracted beam of the 0-order and are incident on the substrate at smaller angles for the finer mask pattern. This gives rise to a problem that the focus depth of the projected image is decreased greatly and a sufficient exposure energy is supplied only to a portion of the thickness of the resist layer.

As a measure for coping with such decrease in the focus depth, Japanese Laid-Open Patent Application No. 2-50417 (laid open on Feb. 20, 1990) discloses the method of arranging an aperture stop concentrically with the optical axis of each of an illumination optical system and a projection optical system to restrict the angles of incidence of an illuminating light on a mask and adjusting the opening diameters of the aperture stops in accordance with a mask pattern. This ensures the focus depth while maintaining the light-and-dark contrast of a projected image on a sample substrate. Even in the case of this known method, however, the diffraction angles of diffracted beams of the ±first-orders and higher-orders are still large as compared with a 0-order diffracted beam reaching substantially vertically to the surface of a substrate and practically all of them come out of the field of view of a projection lens, thereby producing on the substrate a projected mask pattern image composed by substantially only the 0-order beam component and having a weak contrast.

Also, while, in this case, there is the possibility of a part of the ±first-order diffracted beams coming within the field of view of the projection lens and reaching the substrate, in contrast to the 0-order diffracted beam incident substantially vertically on the substrate, the part of the ±first-order diffracted beams is incident on the substrate at a smaller angle and therefore it is pointed out that a satisfactory focus depth is still not obtainable.

On the other hand, U.S. Pat. No. 4,947,413 granted to T. E. Jewell et all discloses a lithography system in which an off-axis illumination light source is used and an interference of the 0-order diffracted beam and only one of the ±first-order beams from a mask pattern is made possible by use of a spatial filter processing in the Fourier transform plane within a projection optical system, thereby forming a high-contrast projected pattern image on the substrate with a high degree of resolution. With this system, however, the illumination light source must be arranged in an off-axis position in which it is obliquely directed to the mask, and also due to the fact that the 0-order diffracted beam and only one of the ±first-order diffracted beams are simply caused to interfere with each other, the dark-and-light contrast of the edges in the pattern image resulting from the interference is still unsatisfactory due to the unbalanced light quantity difference between the 0-order diffracted beam and the first-order diffracted beam.

DISCLOSURE OF INVENTION

It is an object of the present invention to provide a projection exposure method and apparatus so designed that a projected image having a sufficient light-and-dark contrast is produced with a large focus depth on a substrate from the fine mask pattern of the ordinary mask having no phase shifting means, and more particularly it is an object of the invention to positively utilize the fact that the illuminating light has a narrow wavelength distribution, that the mask pattern can be substantially considered to be a diffraction grating, that the resist material has a non-linear light responsive characteristic for the amount of light received and so on as mentioned previously so as to form a resist image of a finer mask pattern for the same wavelength of the illuminating light.

In accordance with a basic idea of the present invention, when using an exposure apparatus including an illumination optical system for illuminating a mask formed at least partially with a fine pattern with an illuminating light and a projection optical system for projecting an image of the illuminated fine pattern on a substrate so as to transfer the fine pattern of the mask on the substrate, the illuminating light is directed from at least two locations to fall on the mask with given angles of incidence in an obliquely opposing manner so that the 0-order diffracted beam and either one of ±first-order diffracted beams produced from the fine pattern by each of the obliquely illuminating beams are respectively passed through optical paths which are substantially equidistant from the optical axis of the projection optical system at or in the vicinity of the Fourier transform plane within the projection optical system with respect to the fine pattern on the mask, thereby forming on the substrate a projected image of the fine pattern principally by either of the ±first-order diffracted beams and the 0-order diffracted beam. In this case, the other undesired beams excluding either of the ±first-order diffracted beams and the 0-order diffracted beam do not substantially reach the substrate. As optical means for this purpose, principally spatial filter means is arranged in the illumination optical system and/or the projection optical system. Also the illumination optical system can be constructed so as to direct the illuminating light along its optical axis and the illumination optical system includes an optical element, e.g., condenser lens means arranged on this side of the mask such that the illuminating light falls at the given angles of incidence on the mask.

An exposure apparatus according to a preferred aspect of the present invention includes an illumination optical system for irradiating an illuminating light on a mask, a projection optical system for projecting an image of the fine pattern on the illuminated mask onto a substrate and spatial filter means arranged at or in the vicinity of the Fourier transform plane within the illumination optical system and/or the projection optical system with respect to the fine pattern on the mask, and the spatial filter means includes at least two window means which are each defined by an independent limited area having a comparatively higher light transmittance than the surrounding at a position apart from the optical axis of the illumination optical system and/or the projection optical system in which it is arranged. The Fourier transform plane at which the spatial filter means is arranged is placed for example in a position that is practically in the pupil plane of the illumination optical system, the conjugate plane to the aforesaid pupil plane or the pupil plane of the projection optical system, and the spatial filter means can be arranged at least in one of these positions.

In accordance with another preferred aspect of the present invention, the spatial filter means includes the two window means at substantially the symmetric positions with the optical axis of the illumination optical system and/or the projection optical system in which it is arranged.

In accordance with another preferred aspect of the present invention, the number of the window means in the spatial filter means is 2n (n is a natural number). Also, the window means is preferably arranged at each of a plurality of positions determined in accordance with the Fourier transform pattern of the fine pattern.

In accordance with another aspect of the present invention, the illumination optical system includes an optical integrator, e.g., fly-eye lenses and in this case the spatial filter means is arranged in a position near to the exit end of the optical integrator.

In accordance with the present invention, the portion of the spatial filter means excluding the window means is generally formed as a dark portion or a light shielding portion whose light transmittance is substantially 0% or so or alternatively it is formed as a light attenuating portion having a predetermined light transmittance which is lower than that of the window means.

In accordance with another aspect of the present invention, the spatial filter means is arranged within the illumination optical system and the positions of its window means are selected such that either one of the ±first-order diffracted beams and the 0-order diffracted beam due to each window means are respectively passed through positions which are practically apart by the equal distance from the optical axis of the projection optical system at or in the vicinity of the Fourier transform plane within the projection optical system with respect to the fine pattern on the mask.

In accordance with another preferred aspect of the present invention, the spatial filter means is arranged within the illumination optical system and the spatial filter means includes first and second window means forming a symmetrical pair with respect to the optical axis of the illumination optical system, with the positions of the first and second window means being so determined that the two diffracted beams, i.e., either one of the ±first-order diffracted beams and the 0-order diffracted beam produced from the fine pattern by the irradiation of the illuminating light beam reaching the mask through the first window means and another two diffracted beams, i.e., either one of the ±first-order diffracted beams and the 0-order diffracted beam produced from the fine pattern by the irradiation of the illuminating light beam reaching the mask through the second window means are alternatively passed through separate first and second optical paths which are apart by practically the equal distance from the optical axis of the projection optical system at or positions near to the Fourier transform plane within the projection optical system, that is, the two diffracted beams, i.e., either one of the ±first-order diffracted beams due to the illuminating light from the first window means and the 0-order diffracted beam due to the illuminating light through the second window means are for example passed through the first optical path and either one of the ±first-order diffracted beams due to the illuminating light through the second window means and the 0-order diffracted beam due to the illuminating light through the first window means are for example passed through the second optical path.

In accordance with another preferred aspect of the present invention, the exposure apparatus includes drive means for varying at least one of the angular positions of the window means about the optical axis and their distance apart from the optical axis in accordance with the fine pattern on the mask for adjusting or switching purposes. Where the spatial filter means comprises a light shielding plate or light attenuating plate including a plurality of window means, the drive means comprises a mechanism for replacing the light shielding plate or the light attenuating plate with one having window means at different positions, whereas if the spatial filter means comprises an electrooptic element which is capable of making transparent or opaque the limited areas at arbitrary positions, such as, a liquid crystal device or an electro chromic device, the drive means comprises electric circuit means for driving the electrooptic element for the purpose of making the limited areas transparent or opaque.

The conventional projection exposure apparatus uses indiscriminately an illuminating light which falls at various angles of incidence on a mask from above so that the respective diffracted beams of the 0-order, ±first-orders, ±second-orders, and higher-orders produced from the mask pattern are directed in practically disordered directions and the positions at which these diffracted beams are imaged through the projection optical system on a substrate are different from one another. On the other hand, the projection exposure apparatus of the present invention selectively uses the illuminating light which is incident on a mask pattern with specified directions and angles from the given positions within a plane intersecting the optical axis at right angles so that either one of the ±first-order diffracted beams and the 0-order diffracted beam produced from the mask pattern by each illuminating beam are mainly directed onto the substrate and chiefly participate in the formation of a projected image of the fine pattern on the substrate. In other words, in accordance with the present invention the spatial filter means corresponding to the mask pattern is used for this purpose so that only optimum one of the ±first-order diffracted beams and the 0-order diffracted beam by each illuminating beam are mainly selected from the illuminating light by the spatial filter means and are directed onto the substrate, thereby forming on the substrate a projected pattern image which is higher in the light-and-dark contrast of the edges of the fine pattern than previously and which is large in focus depth.

In this connection, there are the following two methods for the application of the spatial filter means according to the present invention. More specifically, the first method is such that the illuminating light is intercepted or attenuated at a portion of its beam cross-section on this side of the mask so as to select, as the principal illuminating light, the illuminating light obliquely incident with the specified direction and angle from each of the given positions within the plane intersecting the optical axis at right angles, and for this purpose the spatial filter means is arranged at the Fourier transform plane within the illumination optical system or a position near thereto. The second method is such that of the various diffracted beam components produced from the mask pattern illuminated by the illuminating light of various angles of incidence, the two component beams or either one of the ±first-order diffracted beams and the 0-order diffracted beam produced from the mask pattern by each of the illuminating beams incident obliquely with the given directions and angles from the given positions within the plane intersecting the optical axis at right angles are selected within the projection optical system, and for this purpose the spatial filter means is arranged at the Fourier transform plane within the projection optical system or a position near thereto. These first and second methods may be used in combination and in any way the spatial filter means serves the role of limiting the light beams participating in the formation of a projected pattern image on the substrate to either one of the ±first-order diffracted beams and the 0-order diffracted beam produced from the mask pattern by each of the illuminating beams which are incident obliquely with the specified inclination angles and preventing the other undesired beams from reaching the substrate.

Where the spatial filter means is arranged at the Fourier transform plane within the illumination optical system or a position near thereto, the illuminating light having a given wavelength is projected onto the mask pattern in the form of a diffraction grating with the given angles of incidence from the given eccentric positions in the given angular directions about the optical axis so that theoretically a series of spots due to the Fourier expanded 0-order, first-orders, second-orders and higher-orders diffracted beams are formed at the Fourier transform plane of the projection optical system or positions near thereto. In the conventional projection exposure apparatus, however, the second-orders and higher-orders diffracted beams are eclipsed by the lens tube of the projection optical system.

The spatial filter means arranged at the Fourier transform plane within the illumination optical system or a position near thereto is also designed so that the illuminating light falling substantially vertically on the mask is intercepted or attenuated and that the illuminating light to be incident on the mask at the given angles of inclination from the given eccentric positions in the given angular directions about the optical axis is selectively passed with a high light transmittance. In this case, if the diffracted beams of the second-orders and higher-orders are not desired, another spatial filter means is further provided at the Fourier transform plane within the projection optical system or in the vicinity thereof to block or attenuate these beams. As a result, a high-contrast projected pattern image is formed on the substrate by the 0-order diffracted beam and the first-order diffracted beams produced from the mask pattern by the illuminating light at the preferred angles of incidence.

Then, with the mask patterns for semiconductor memory devices and liquid crystal devices, there are many cases where the portion of the mask pattern requiring a high-resolution transfer has a pattern composed of a grating pattern in which basically equispaced transparent and opaque lines are regularly arranged alternately and this can be generally considered to be a repetition pattern of rectangular waveforms at the duty ratio of 0.5. Where the spatial filter means is arranged at the Fourier transform plane within the illumination optical system or a position near thereto, due to the diffracted beams produced from the grating pattern, a series of spots of the diffracted beams of the 0-order, ±first-orders, ±second-orders and higher-orders are formed at the Fourier transform plane of the projection optical system so as to be distributed in the direction of traversing the lines of the grating (the direction in which the lines are arranged). At this time, in the like manner known as the ordinary Fourier expansion of a rectangular wave, the 0-order diffracted beam provides a reference level for the light quantity in the projected image on the substrate and the ±first-order diffracted beams are the light quantity variation components of the sinusoidal waveform having the same period as the grating, so that when these diffracted beam components are condensed on the substrate, the interference of these diffracted beams produces on the substrate an imaged pattern having a sufficient light quantity for the sensitization of the resist layer and a high light-and-dark contrast.

Also, in this case the ordinary mask pattern for semiconductor memory devices and liquid crystal devices can be considered to be a combination of a plurality of gratings which are respectively arranged vertically or transversely on the mask so that if spatial filter means is prepared so as to ensure illuminating light beams having the optimum eccentric positions in the angular directions about the optical axis and the optimum angles of incidence for each grating, the resulting Fourier pattern formed at the Fourier transform plane of the projection optical system forms a spot group arranged in the angular directions corresponding to the line arranging directions of the gratings and having the spacings corresponding to the wavelength of the illuminating light and the line pitches of the gratings. The light intensity of each spot is dependent on the number of pitches of the gratings and the orders of the diffracted beams.

As will be seen from this fact, the same effect can be obtained by arranging within the projection optical system spatial filter means formed with window means only at the positions corresponding to the required spot positions so as to select the diffracted beams directed to the substrate. In this case, the spatial filter means arranged at the Fourier transform plane or a position near thereto includes the window means at the spot positions of the useful diffracted beams in the Fourier transform plane so that the useful diffracted beams are selectively passed while blocking the undesired diffracted beams which cause deterioration of the contrast at the substrate surface.

Thus, the number and positions of the windows in the spatial filter means inherently differ depending on the mask pattern so that when the mask is changed, the spatial filter means is also changed in company therewith as a matter of course and moreover it must be exactly adjusted in position relative to the mask.

Next, a description will be made of the reason why the focus depth is increased by projecting the illuminating light beams of the given angles of incidence onto the mask pattern from the given eccentric positions in the given angular directions about the optical axis and forming an imaged pattern on the substrate by means of either one of the ±first-order diffracted beams and the 0-order diffracted beam produced from the mask pattern by each of the illuminating light beams.

Generally, where the substrate is in registration with the focal position of the projection optical system, the diffracted beams of the respective orders which emerge from one point on the mask and reach one point on the substrate are all equal in optical path length irrespective of the portions of the projection optical system through which they pass so that even in cases where the 0-order diffracted beam passes through practically the center of the pupil plane of the projection optical system, the 0-order diffracted beam and the diffracted beams of the other orders are equal in optical path length and, with the optical path length of the light beam passing practically the center of the Fourier transform plane being taken as a reference, the difference between the optical path length of the light beam passing through any arbitrary position of the Fourier transform plane and the reference optical path length or the front wave aberration is zero. Where the substrate is in a defocus position which is not in registration with the focal position of the projection optical system, however, the optical path length of the diffracted beam having any of the first and higher orders and passing any closer-to-outer-periphery portion of the Fourier transform plane within the projection optical system to fall obliquely on the substrate is decreased as compared with the 0-order diffracted beam passing through or near the center of the Fourier transform plane when the substrate is positioned before the focal point and the amount of defocus is negative, whereas it is increased when the substrate is positioned in the rear of the focal point and the amount of defocus is positive; this difference in optical path length has a value corresponding to the difference in angle of incidence on the substrate between the diffracted beams of the respective orders and this is referred to as the front wave aberration due to the defocus. In other words, due to the presence of such defocus, each of the diffracted beams of the first and higher orders causes a front wave aberration with respect to the 0-order diffracted beam and the imaged pattern in either the front or the rear of the focal point is blurred. This front wave aberration $\Delta W$ is given by the following equation:

$$\Delta W = 1/2 \times (NA)^2 \cdot \Delta f$$

where $\Delta f$ = the amount of defocus

NA = the value of the distance from the center in the Fourier transform plane given in terms of the numerical aperture.

As a result, in relation to the 0-order diffracted beam ($\Delta W = 0$) passing through practically the center of the Fourier transform plane, the first-order diffracted beam passing through the position of a radius $r_1$ near the outer periphery of the Fourier transform plane has the following front wave aberration $$\Delta W = 1/2 \times r_1^2 \times \Delta f$$

and the presence of this front wave aberration is the cause of deterioration of the resolution before and behind the focal position and reduction in the focus depth in the conventional techniques.

On the other hand, in the exposure apparatus of the present invention the spatial filter means is arranged such that either one of the ±first-order diffracted beams and the 0-order diffracted beam produced from the mask pattern by each of the illuminating light beams of the given angles of incidence are respectively passed through the eccentric positions (having the same eccentric radius $r_2$) of substantially the central symmetry in the Fourier transform plane within the projection optical system. As a result, in the case of the exposure apparatus of the present invention the front wave aberrations caused by the 0-order diffracted beam and the first-order diffracted beams before and behind the focal point of the projection optical system are both given as follows $$\Delta W = 1/2 \times r_2^2 \, \Delta f$$

and they are equal to each other. Thus, there is no deterioration (blur) of the image quality caused by the front wave aberrations due to the defocus, that is, the correspondingly increased focus depth is obtained.

On the other hand, where the spatial filter means is arranged within the illumination optical system, a pair of the illuminating light beams passed through the pair of the window means symmetric with the optical axis take the form of light beams which are incident on the mask surface obliquely and symmetrically on both sides of the normal so that each one of the ±first-order diffracted beams produced from the grating pattern on the mask by these light beams passes a position which is symmetric with the 0-order diffracted beam with respect to the optical axis of the projection optical system and falls on the substrate at an angle of incidence as large as that of the 0-order diffracted beam. As a result, the substantial numerical aperture of the projection optical system participating in the imaging is reduced thereby ensuring a greater focus depth.

Thus, in accordance with the present invention, by virtue of the fact that the spatial filter means having the windows of the paired structure on both sides of the optical axis is used such that, of the diffracted beams produced from the fine pattern on the mask by the illuminating light beams of the preferred angles of incidence, the diffracted beams of the preferred orders, i.e., the 0-order diffracted beam and the first-order diffracted beams are selectively condensed at the same position on the substrate so that even in the case of such fine pattern which has never been resolved in the past, it is now possible to ensure a satisfactory light-and-dark contrast and a satisfactorily large focus depth for sensitizing the resist layer in the imaged pattern on the substrate without any change of the illuminating light and the projection optical system.

Where the spatial filter means is arranged within the illumination optical system, the spacing between the pair of windows in the spatial filter means is such that either one of the ±first-order diffracted beams produced from the fine grating pattern of the mask by the illuminating light passing through one of the windows and the 0-order diffracted beam produced by the illuminating light passing through the other window are passed through substantially the same eccentric position in the Fourier transform plane of the projection optical system.

Where the spatial filter means is arranged within the projection optical system, the spacing between the pair of windows in the spatial filter means is determined in such a manner that either one of the ±first-order diffracted beams and the 0-order diffracted beam produced from the fine grating pattern of the mask by each of the illuminating beams of the preferred angles of incidence are respectively passed through separate eccentric positions.

In accordance with the exposure apparatus of the present invention, a suitable adjusting mechanism is used so that the spatial filter means is rotated through a certain angle or parallelly moved within the plane of its arrangement so as to compensate for the shifts in the positions of the windows of the spatial filter means relative to the mask pattern. Also, the spacing between the pair of windows may be constructed so as to be adjustable to conform more satisfactorily with the Fourier pattern of the mask pattern. In this case, by constructing so that the positions of the windows in the spatial filter or the spacing between the windows can be varied by the adjusting mechanism, it is possible to obtain the optimal positional relation between the mask and the windows of the spatial filter and also it is possible to use the same spatial filter in common with other masks containing different patterns.

In accordance with another aspect of the present invention, a spatial filter incorporating an electrooptical element such as a liquid crystal device or an electro chromic device is employed so that the adjustment of the positions and size of its windows can be effected by means of electric signals. In this case, due to the fact that the limited areas at the arbitrary positions of the spatial filter composed of the electrooptical element can be freely adjusted to become transparent or opaque, it is possible to obtain the optical positional relation between the mask pattern and the windows of the spatial filter and in this case it is of course possible to use the same spatial filter in common with other masks containing different patterns.

In order to facilitate the understanding of the above and other features and advantages of the present invention, some preferred embodiments of the invention will be described hereunder with reference to the accompanying drawings.

BRIEF DESCRIPTION OF THE DRAWINGS

FIG. 7 is a schematic diagram showing the optical path construction of a projection exposure apparatus according to a reference example, FIG. 8 is a diagram showing schematically the intensity distribution of the diffracted beams at the Fourier transform plane of the projection optical system in FIG. 7, FIG. 9 is a schematic diagram showing the optical path construction of a projection exposure apparatus according to another reference example, FIG. 10 is a diagram showing in a schematic diversified form the intensity distribution of the diffracted beams at the Fourier transform plane of the projection optical system in the reference example of FIG. 9.

BEST MODE FOR CARRYING OUT THE INVENTION

Figure 1:
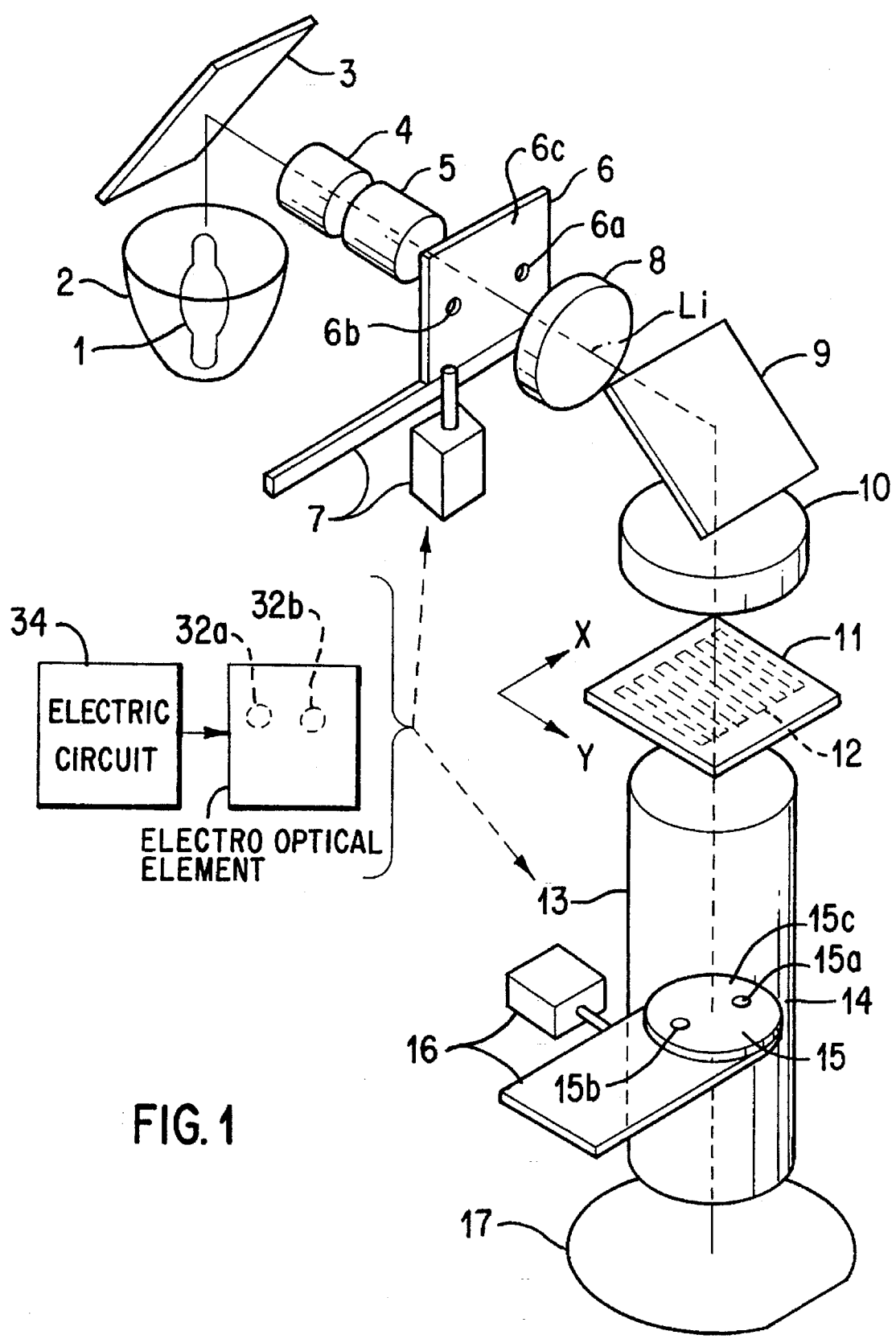
FIG. 1 is a perspective view showing the construction of an exposure apparatus according to an embodiment of the present invention.

In the Embodiment shown in FIG. 1, a mask 11 is formed with a one-dimensional grating pattern 12 having a duty ratio of 0.5 as a typical exemplary fine pattern. An illumination optical system for illuminating the mask 11 includes a mercury vapor lamp 1, an ellipsoidal mirror 2, a cold mirror 3, a condensing optical element 4, an optical integrator element 5, a relay lens 8 (a pupil relay system), a mirror 9 and a condenser lens 10. A spatial filter 6 is arranged at the Fourier transform plane of the illumination optical system or in the vicinity of the exit end of the integrator element 5 where the secondary light source image of the mercury vapor lamp 1 is formed (in other words, the pupil plane of the illumination optical system or its conjugate plane or any position near thereto). The spatial filter 6 is formed with a pair of transparent windows 6a and 6b whose positions and size are determined in accordance with the two-dimensional Fourier transform of the mask pattern 12.

Also, a spatial filter 15 having similarly a pair of transparent windows 15a and 15b is arranged at the Fourier transform plane 14 of a projection optical system 13 for projecting an image of the pattern 12 onto a wafer 17. Since a one-dimensional diffraction grating pattern is used as the pattern 12 in the present embodiment, the spatial filters 6 and 15 are each formed with the pair of transparent windows 6a and 6b or 15a and 15b respectively, so that each pair of transparent windows are placed in practically symmetrical positions on both sides of the optical axis of the optical system and their direction of arrangement coincides optically with the line pitch direction of the grating pattern 12 within the plane of arrangement thereof. Also, the spatial filters 6 and 15 are respectively provided with driving mechanisms 7 and 16 each composed of a motor, a cam, etc., so that the spatial filters 6 and 15 are replaceable with different ones depending on the mask pattern and the positions of the transparent windows 6a and 6b or 15a and 15b can undergo fine adjustment within the plane of arrangement of each spatial filter. It is to be noted that the opening shape of the transparent windows 6a, 6b and 15a, 15b of the spatial filters 6 and 15 can be determined arbitrarily and in FIG. 1 they are shown as having circular openings by way of example without any intention of limiting thereof. Further, while the spatial filters 6 and 15 are each composed of a light shielding plate 6c formed with a pair of openings as transparent windows, the spatial filters 6 and 15 may each be composed of an electrooptic element 32 such as a liquid crystal device or electro chromic device and in this case each of the illustrated driving mechanisms 7 and 16 is composed of electric circuitry 34 for causing a transparent portion of a suitable size and shape at each of arbitrary limited areas 32a and 32b of the electrooptical element 32.

With the exposure apparatus constructed as described above, the illuminating light produced from the mercury vapor lamp 1 arranged at the first focal point of the ellipsoidal mirror 2 is reflected by the ellipsoidal mirror 2 and the cold mirror 3 so that after the illuminating light has been condensed at the second focal point of the ellipsoidal mirror 2, it is passed through the condensing optical element 4 composed for example of a collimator lens or light beam distribution compensating cone prism and through the integrator element 5 comprising a group of fly-eye lenses thereby forming a substantial plane source of light in the plane of arrangement of the spatial filter 6. It is to be noted that in the present embodiment the so-called Köhler's illumination is used in which the secondary light source image of the integrator element 5 is formed at the Fourier transform plane 14 of the projection optical system 13. While this plane light source itself should project the illuminating light at various angles of incidence onto the mask from above as in the past, since the spatial filter 6 is arranged on this side of the condenser lens 10 in this case, only the collimated light beams passing through the transparent windows 6a and 6b of the spatial filter 6 fall on the mask 11 at given oblique angles of incidence and symmetrically with the optical axis within the plane crossing the lines of the grating pattern 12 through the relay lens 8, the mirror 9 and the condenser lens 10.

When the collimated beams are projected onto the pattern 12 of the mask 11, diffracted beams of the 0-order, ±first-orders, ±second-orders and higher-orders are produced from the pattern 12. Here, since the transparent windows 6a and 6b of the spatial filter 6 arranged at the Fourier transform plane 14 of the illuminating optical system determine the distances of the collimated light beams from the optical axis as well as their positions about the optical axis and the condenser lens 10 determines the angles of incidence of the collimated light beams onto the pattern 12 of the mask 11, of the diffracted beams of the various orders those directed to the projection optical system 13 from each window are practically only either one of the ±first-order diffracted beams and the 0-order diffracted beam and the other diffracted beams are very small in quantity. As a result, principal diffracted beam spots due to either of the first-order diffracted beams and the 0-order diffracted beam and diffracted beam spots of the other undesired orders are formed at the Fourier transform plane of the projection optical system 13 in accordance with the Fourier expanded pattern. The other spatial filter 15 arranged at the Fourier transform plane 14 of the projection optical system 13 selectively passes only the principal diffracted beams toward the wafer 17 and intercepts the diffracted beams of the other undesired orders. In this case, the positions of the spatial filters 6 and 15 are adjusted relative to the pattern 12 of the mask 11 by the driving mechanisms 7 and 16, respectively, so that the principal diffracted beams or either of the ±first-order diffracted beams and the 0-order diffracted beams are passed with the maximum intensity and the other undesired diffracted beams are blocked completely.

Figure 2:
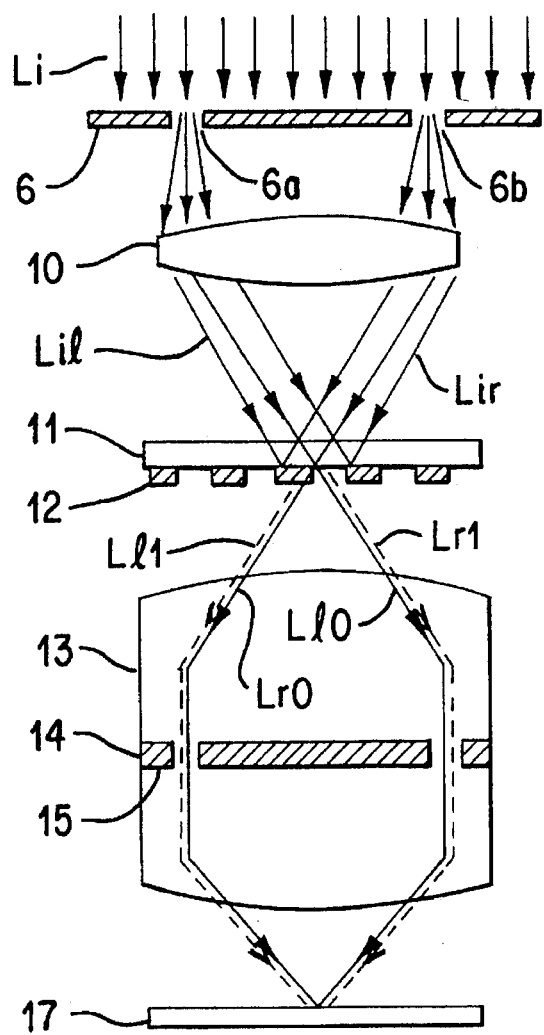
FIG. 2 is a schematic diagram showing an optical path construction for explaining the principle of the embodiment of FIG. 1.

FIG. 2 shows schematically the basic optical path construction for the illuminating light in the exposure apparatus according to the present embodiment. While, in the Figure, the spatial filter 6 is arranged just above the condenser lens 10 for purposes of illustration, this position is a conjugate plane to the spatial filter 6 of FIG. 1 with respect to the relay lens 8 and this construction is substantially the same in function and effect with the case of FIG. 1.

In FIG. 2, if NA represents the numerical aperture of the projection optical system and $\lambda$ the wavelength of the illuminating light, the pitch of the pattern 12 is selected to be 0.75 times $\lambda/NA$ and the line-to-space ratio of the pattern 12 is selected 1:1 (the duty ratio of the grating is 0.5). In this case, with the wavelength $\lambda$ taken into consideration, the Fourier transform q(u, v) of the pattern 12 is given as follows if the pattern 12 is represented by p(x, y)

$$q(u,v) = \iint p(x,y) \cdot \exp\{-2\pi i(ux+vy)/\lambda\} dx dy$$

Figure 4:
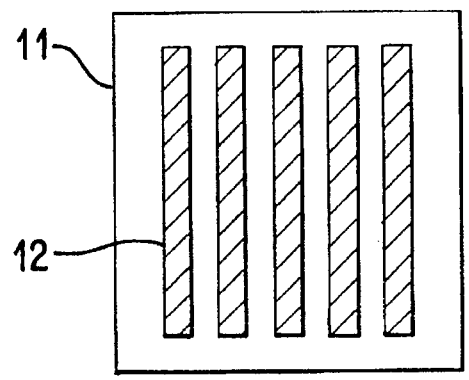
FIG. 4 is a schematic plan view showing an example of the mask pattern.

Also, where the pattern 12 is uniform vertically or in the y-direction and varies regularly in the x-direction as shown in FIG. 4, if the x-direction line-to-space ratio is 1:1 and the line pitch is 0.75 $\lambda/NA$, the following equation holds $$q(u,v) = q_1(u) \times q_2(v)$$

therefore, the following hold

| | |
|---|---|
| $q_1(u) = 1$, | $u = 0$ |
| $q_1(u) = 0.637$, | $u = \pm NA/0.75$ |
| $q_1(u) = -0.212$, | $u = \pm 3\, NA/0.75$ |
| . | . |
| . | . |
| . | . |
| $q_1(u) = 0.637/(2n-1)(-1)^{(n+1)}$, | $u = \pm(2n-1) \cdot NA/0.75$ |
| $q_1(u) = 0$ | |

-continued

| | u is other than the foregoing |
|---|---|
| and | |
| $q_2(v) = 1$, | $v = 0$ |
| $q_2(v) = 0$, | $v \neq 0$ |

Figure 3:
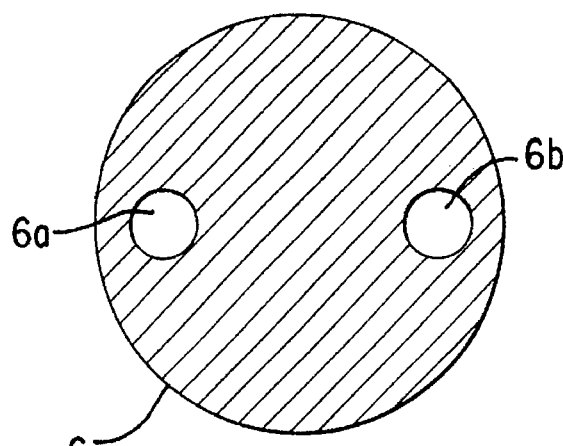
FIG. 3 is a plan view showing an example of the spatial filter arranged within the illumination optical system of the exposure apparatus according to the embodiment of FIG. 1.
Figure 5A:
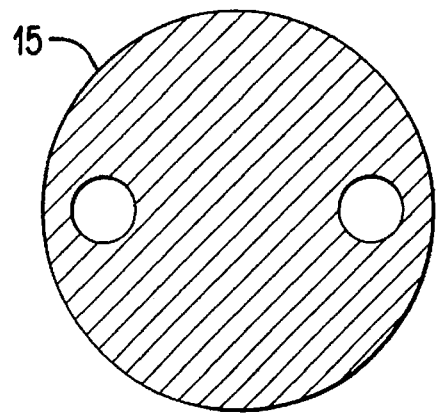
FIGS. 5a and 5b are schematic plan views showing respectively another examples of the spatial filter.

FIGS. 3 and 5a are respectively plan views of the spatial filter 6 for the illumination optical system and the spatial filter 15 for the projection optical system which are used in the present embodiment.

The spatial filters 6 and 15 are such that with the following showing the peak values of the Fourier transform energy distribution $|q(u,v)|^2$ $(u,v)=(0, 0), (\pm NA/0.75, 0), (\pm 3\ NA/0.75, 0) \ldots$ with the following showing ½ thereof $(u,v)=(0, 0), (\pm NA/1.5, 0), (\pm 2\ NA, 0) \ldots$ the positions falling within the numerical aperture of the projection optical system 13 or the following $(u,v)=(\pm NA/1.5, 0)$ or their nearby positions are selected to be the transparent windows 6a, 6b and 15a, 15b, respectively, and the positions or the following are selected to be the light shielding portions.

$(u,v)=(0, 0)$

It is to be noted that the positions of the spatial filters 6 and 15 or the following are respectively adjusted by the driving mechanisms 7 and 16 of FIG. 1 so as to coincide with the optical axes of the illumination optical system (1 to 10) and the projection optical system 13, respectively. Each of the spatial filters 6 and 15 may for example be composed of an opaque metal sheet which is selectively removed to form its transparent windows or a transparent holding sheet coated with a thin film of metal or the like by patterning to form its transparent windows. Also, while, in the embodiment shown in FIG. 1, the illuminating light source comprises the mercury vapor lamp 1, it may be composed of any other light source such as a laser light source. Further, while, in this embodiment, the pattern 12 of the mask 11 comprises a line-and-space pattern varying only in the x-direction at a duty ratio of 1:1, the present invention is also applicable to other patterns varying in a plurality of arbitrary directions regularly.

In FIG. 2, as the result of the arrangement of the illustrated spatial filter 6 at the Fourier transform plane of the pattern 12 within the illuminating optical system for the pattern 12 having the line pitch of 0.75 λ/NA, the illuminating light Li for illuminating the pattern 12 is limited for example to collimated light beams Lil and Lir. When the illuminating beams Lil and Lir are projected onto the pattern 12, their diffracted beams are produced from the pattern 12.

Assuming that the 0-order diffracted beam and the +first-order diffracted beam of the illuminating beam Lil are respectively represented as Ll0 and Ll1 and the 0-order diffracted beam and the –first-order diffracted beam of the illuminating beam Lir as Lr0 and Lr1, the deviation angles between the diffracted beams Ll0 and Ll1 and between diffracted beams Lr0 and Lr1 are both given by the following $\sin\theta = \lambda/(\text{line pitch of pattern } 12)$
$= \lambda/(0.75\lambda/NA)$
$= NA/0.75$ and since the incident beams Lil and Lir are initially apart by 2NA/1.5 from each other, at the Fourier transform plane of the projection optical system 13 the diffracted beams Ll0 and Lr1 pass through the same first optical path, whereas the diffracted beams Lr0 and Ll1 pass through the same second optical path. In this case, the first and second optical paths are symmetrically apart by the equal distance from the optical axis of the projection optical system 13.

Figure 6A:
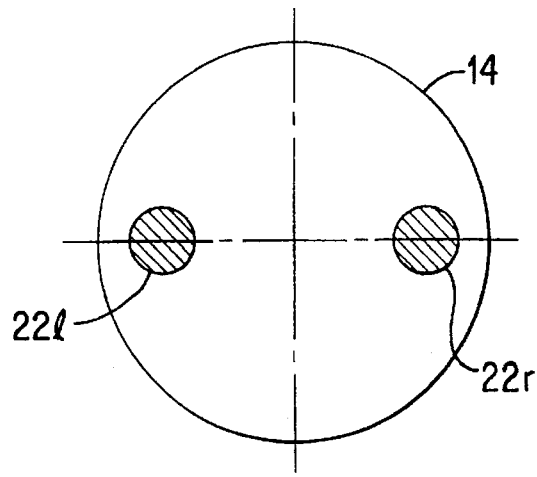
FIGS. 6a and 6b are diagrams showing schematically the light intensity distributions of the diffracted beams at the Fourier transform plane of the projection optical system in correspondence to FIGS. 5a and 5b, respectively.

FIG. 6a shows schematically the intensity distribution of the diffracted beams at the Fourier transform plane 14 of the projection optical system 13. In FIG. 6a, a spot 22l formed at the Fourier transform plane 14 is the result of the convergence of the diffracted beams Lr0 and Ll1 and similarly a spot 22r is one resulting from the convergence of the diffracted beams Ll0 and Lr1.

As will be seen from FIG. 6a, in accordance with the present embodiment each combination of the 0-order diffracted beam and the +first-order or –first-order diffracted beam from the pattern 12 having a line pitch of 0.75 λ/NA finer than λ/NA can be condensed almost 100% on the wafer 17 through the projection optical system 13, so that even in the case of finer pattern than that pitch (λ/NA) representing the limit to the resolution of the conventional exposure apparatus, the use of the spatial filters having the transparent windows of the dimensions corresponding to the line pitches of the mask patterns makes it possible to effect the exposure and transfer with sufficient resolutions.

Figure 5B:
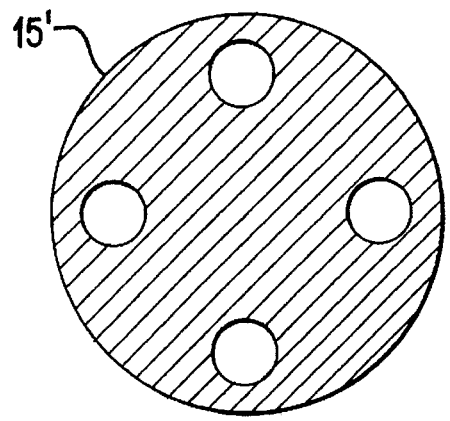
Figure 6B:
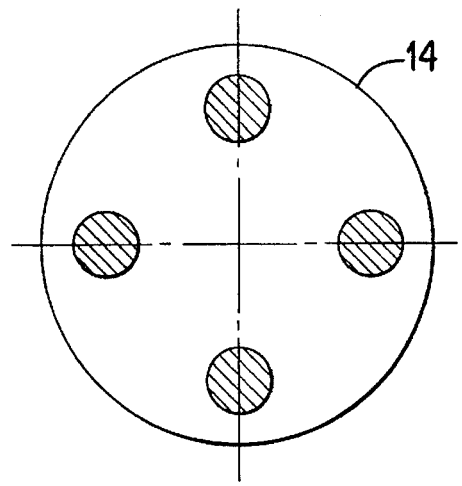

Referring now to FIG. 5b, there is illustrated a spatial filter which is used in the case of a mask pattern consisting of a line-and-space pattern crossing in the x and y directions. Also, FIG. 6b shows the conditions of the spots formed in correspondence to the diffracted beams at the Fourier transform plane of the projection optical system in the case of FIG. 5b.

Next, the resolution of the pattern on the substrate 17 in the exposure apparatus of the present embodiment will be described in comparison with exposure apparatus according to various reference examples.

= In the case of reference examples =

FIGS. 7 and 8 respectively show schematically the optical path construction of the illuminating light (FIG. 7) and the light quantity distribution at the Fourier transform plane of the projection optical system (FIG. 8) in the projection exposure apparatus shown in the previously mentioned Japanese Laid-Open Patent Application No.2-50417 cited as a reference example. It is to be noted that in the Figures the components which are the same in operation and function as in the apparatus according to the above-mentioned embodiment of the present invention are designated by the same reference numerals as in FIG. 2.

In FIG. 7, an aperture stop 6A (a spatial filter having a circular transparent window formed concentrically with the optical axis) is arranged at the Fourier transform plane of the illumination optical system thereby limiting the angle of incidence of the illuminating light on the mask 11. The 0-order diffracted beam (the solid lines) and the ±first-order diffracted beams (the broken lines) produced from the pattern 12 of the mask 11 are both entered into the projection optical system 13 and proceed along separate optical paths so that a spot 20l of the +first-order diffracted beam, a spot 20c of the 0-order diffracted beam and a spot 20r of the –first-order diffracted beam are formed at separate positions apart from one another in the Fourier transform plane 14 as shown in FIG. 8.

Also, FIGS. 9 and 10 respectively show schematically the optical path construction of the illuminating light (FIG. 9) and the light quantity distribution at the Fourier transform plane of the projection optical system (FIG. 10) in a projection exposure apparatus cited as another reference example. In this another reference example, the aperture stop 6A of FIG. 7 is replaced with a spatial filter 6B formed with an annular transparent window which is concentric with the optical axis.

In FIG. 9, provided at the Fourier transform plane of the illumination optical system is the spatial filter 6B having the annular transparent window formed concentrically with the optical axis so that the illuminating light is obliquely projected or in an inverse conical form onto the mask 11. As a result, at least within the plane traversing the optical axis in the line pitch direction of the pattern 12, as in the case of the embodiment of the present invention shown in FIG. 2, the 0-order diffracted beam (the solid lines) is obliquely entered like the first-order diffracted beams (the broken lines) into the projection optical system so that they pass through the projection optical system while partly overlapping the separate first-order diffracted beams entering from the opposite sides and then reach up to the wafer 17, thereby forming a projected image. At this time, a doughnut shaped spot 21c of the 0-order diffracted beam which is concentric with the optical axis as well as a spot 21l of the +first-order diffracted beam and a spot 21r of the −first-order diffracted beam which are adjacent to and partly overlapping the spot 21c are formed in the Fourier transform plane 14 of the projection optical system 13 as shown in FIG. 10. In this case, the large parts of the spots 21l and 21r extend to the outside of the projection optical system 13 and the beams of these externally extended portions are eclipsed by the lens barrel of the projection optical system.

= In the case of the embodiment of the present invention =

FIGS. 11 to 14 are diagrams showing the distributions of the light intensities I of the projected images on the wafer 17 in the embodiment of the present invention shown in FIG. 2 in comparison with the cases of FIGS. 7 and 9. These light intensities are in conformity with the results obtained by calculation with respect to within the plane traversing the optical axis in the line pitch direction of the pattern 12 on the substrate with the NA of the projection optical system being selected 0.5, the wavelength $\lambda$ of the illuminating light selected 0.365 µm and the pattern line pitch of the mask pattern 12 selected 0.5 µm (about 0.685×$\lambda$/NA) in terms of the value on the wafer 17 obtained from the magnification of the projection optical system 13.

Figure 11:
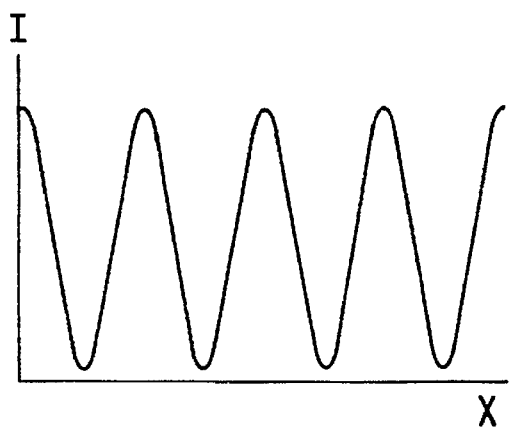
FIG. 11 is a graph showing the light quantity distribution of the projected image in the embodiment of the present invention.

FIG. 11 shows the light intensity distribution of the projected image formed on the substrate by the exposure apparatus according to the previously mentioned embodiment (FIG. 2) of the present invention and it will be seen that this intensity distribution has a sufficient light-and-dark contrast of the edges of the pattern.

Figure 12:
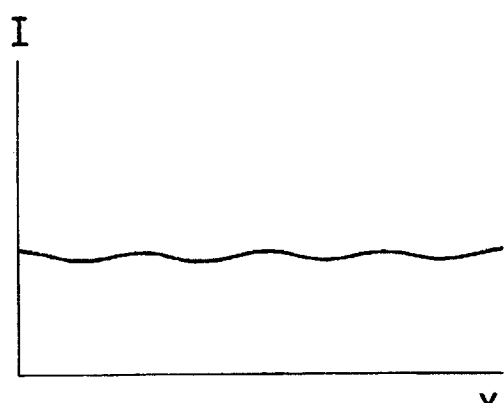
FIG. 12 is a graph showing the light quantity distribution of the projected image in the reference example of FIG. 7 (where σ=0.5)

FIG. 12 shows the light intensity distribution of the projected image on the substrate in the case where the diameter of the aperture stop 6A is relatively small and the ratio of the numerical aperture of the illumination optical system to the numerical aperture of the projection optical system or the so-called $\sigma$ value is selected 0.5 in the reference example of FIG. 7. In this case, it will be seen that since the ratio ($\sigma$ value) of the numerical aperture of the illumination optical system to the numerical aperture of the projection optical system is selected 0.5, the projected image has a flat light intensity distribution without practically any light-and-dark contrast.

Figure 13:
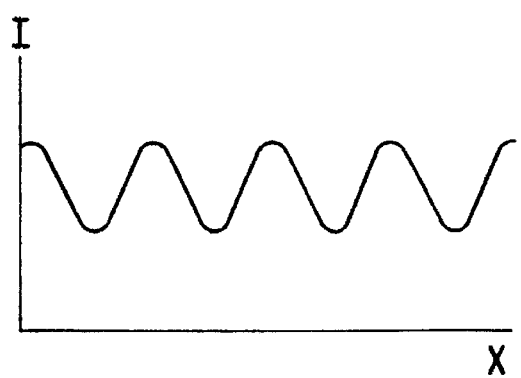
FIG. 13 is a graph showing the light quantity distribution of the projected image in the reference example of FIG. 7 (where σ=0.9)

FIG. 13 shows the light intensity distribution of the projected image in the case where the opening of the aperture stop 6A is relatively large and the ratio of the numerical aperture of the illumination optical system to the numerical aperture of the projection optical system or the so-called $\sigma$ value is selected 0.9 in the reference example of FIG. 7. In this case, it will be seen that while the light-and-dark contrast of the projected image is greater than in the case of FIG. 12 due to the fact that the ratio ($\sigma$ value) of the numerical aperture of the illumination optical system to the numerical aperture of the projection optical system is selected 0.9, the light intensity distribution is still relatively large in 0-order diffracted beam component and comparatively flat and thus it is unsatisfactory from the standpoint of the light-response characteristic of the resist.

Figure 14:
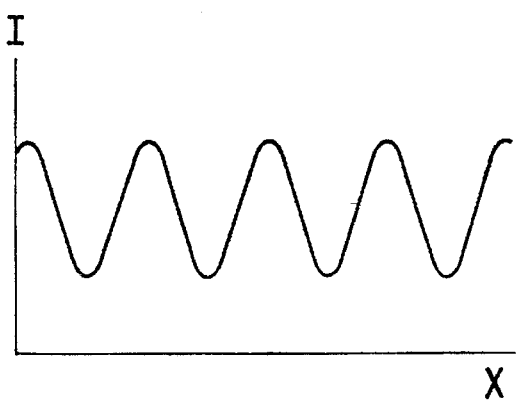
FIG. 14 is a graph showing the light quantity distribution of the projected image in the reference example of FIG. 9.

FIG. 14 shows the light intensity distribution of the projected image on the substrate in the case of the reference example of FIG. 9 and in this case the inner and outer edges of the annular transparent window of the spatial filter 6B respectively correspond to 0.7 and 0.9 in terms of the $\sigma$ value. While this projected image is stronger in light-and-dark contrast than in the case of FIG. 12, the light intensity distribution is still relatively large in 0-order diffracted beam component and comparatively flat and thus it is still insufficient from the standpoint of the light-response characteristic of the resist.

As will be seen from FIGS. 11 to 14, in accordance with the embodiment of the present invention shown in FIG. 2 the substantial resolution of the projected image on the substrate is greatly improved as compared with the cases of FIGS. 7 and 9.

Then, in the case of FIG. 9, if a spatial filter of the same type as the spatial filter 15 used in the previously mentioned embodiment is similarly arranged at the Fourier transform plane of the projection optical system 13, the diffracted beams of the 0-order and ±first-orders can be selectively condensed at the portions indicated by the cross hatching in FIG. 10 so as to slightly improve the resolution of the projected image on the wafer 17 as compared with the case of FIG. 14. In this case, however, there is the unavoidable disadvantage that the utilization rate of the illuminating light incident on the projection optical system is decreased greatly and the energy component not contributing to the exposure is accumulated within the projection optical system thereby changing its optical characteristics. In the embodiment of FIG. 2 according to the present invention, practically all the energy of the illuminating light incident on the projection optical system contributes to the exposure.

Then, even in the past, there has been known the technique of positively utilizing the diffracted beams from a mask pattern to improve the resolution of the projection optical system and this technique is such that dielectric members for reversing the phase of the illuminating light, i.e., the so-called phase shifters are arranged alternately with the transparent portions of the pattern. However, actually it is extremely difficult to properly provide such phase shifters on a complicated semiconductor circuit pattern and no inspection method for phase shifted photomasks has been established as yet.

With the embodiment of FIG. 2 according to the present invention, while its effect of improving the resolution of the projected image is comparable to that of the phase shifters, it is possible to use a conventional photomask without phase shifters as such and it is possible to follow the conventional photomask inspection techniques as such.

Also, while the use of the phase shifters has the effect of increasing in effect the focus depth of the projection optical system, even in the embodiment of FIG. 2, as shown in FIG. 6a, the spots 22l and 22r at the Fourier transform plane 14 are in the equidistant positions from the center of the pupil so that they are less susceptible to the effect of the front wave aberrations due to the defocusing as mentioned previously and a large focus depth is obtained.

While, in the above-described embodiment, the mask pattern comprises by way of example a line-and-space pattern which varies regularly in the x-direction, the foregoing effect can be fully attained on the ordinary patterns other than the line-and-space pattern by combining proper spatial filters in the respective cases. Then, while the number of the windows in the spatial filer is two when the mask pattern has a one-dimensional variation which varies only in the x-direction, in the case of a pattern having a plurality of n dimensional variations, the number of the required transparent windows is 2n in accordance with the spatial frequency of the pattern. For instance, in the case of a diffraction grating pattern having a two-dimensional variation in the x and y directions, for example, as shown in FIG. 5b, it is necessary to form two pairs or a total of four transparent windows arranged on the cross in the spatial filter so that the four corresponding diffracted beam spots are formed at the Fourier transform plane of the projection optical system as shown in FIG. 6b.

Also, while, in the above-described embodiment, each of the plates 6c and 15c of the spatial filters 6 and 16 is considered as one which does not transmit the illuminating light at all for purposes of simplifying the description, each of the plates 6c and 15c may be constructed as a light attenuating plate having a certain predetermined degree of light transmittance so that in this case, only the contrast of a projected image of any specified fine pattern can be selectively improved during the exposure by the front beam cross-section of the illuminating light as in the past.

Further, while the description of the embodiment has been made with particular emphasis on the spatial filter within the illumination optical system, it can be considered that the spatial filter within the projection optical system is basically the same in function and effect. In other words, the same effect can be obtained by arranging a spatial filter satisfying the above-mentioned conditions at least at one of substantially the Fourier transform plane of the illumination optical system and substantially the Fourier transform plane of the projection optical system. Also, as for example, it is possible to arrange a spatial filter such as shown in FIG. 3 at the Fourier transform plane of the illumination optical system and a spatial filter having an annular transparent window at the Fourier transform plane of the projection optical system. In this case, it is needless to say that with the latter spatial filter having the annular transparent window, the annular transparent window must be arranged in such a manner that both of the 0-order diffracted beam and the +first-order (or the −first-order) diffracted beam from the mask pattern are passed together through it. Further, by using the two spatial filters in combination, there is the effect of cutting off the diffused reflection from the projection optical system or the wafer and preventing the stray light rays.

Still further, while, in the above-described embodiment, the description is mainly directed to the case where the spatial filters (6, 15) are mechanically changed in dependence on the mask pattern, if, for example, a spatial filter comprising a liquid crystal device, an EC (electro chromic) device or the like is used, there are advantages that not only the use of any mechanical filter changing mechanism is eliminated but also the adjustment and change of the positions of transparent windows is attained by means of electric circuitry, that the apparatus is made more compact in size and that the adjustment and change of the size, shape and position of transparent windows can be effected easily and at high speeds.

The embodiments described herein are for the purpose of illustration without any intention of limitation and the technical scope of the present invention is intended to be limited in accordance with the statement of the appended claims.

I claim:

1. An exposure apparatus comprising:
   an illumination optical system for irradiating an illuminating light from a light source on a mask,
   a projection optical system for projecting an image of a pattern formed on said illuminated mask onto a substrate, and
   an aperture member arranged at the Fourier transform plane within said illumination optical system with respect to said pattern of said mask or a position near thereto, said aperture member being located between said mask and said light source within said illumination optical system that produces such light, said aperture member being provided with at least two separate localized areas having a higher light transmittance than portions of said aperture member surrounding said areas and being arranged at positions spaced from an optical axis of said illumination optical system by a distance corresponding to a fineness of said pattern, such that one component of a first beam from a first one of said areas passes through said projection optical system along substantially a same path as one component of a second beam from a second one of said areas, and such that another component of said first beam passes through said projection optical system along substantially a same path as another component of said second beam.

2. An exposure apparatus according to claim 1, wherein said aperture member includes first and second localized light transmitting areas forming a symmetrical pair with the optical axis of said illumination optical system.

3. An exposure apparatus according to claim 2, wherein said first and second localized light transmitting areas forming said symmetrical pair are positioned such that a 0-order diffracted beam produced from said pattern by the irradiation of a first illuminating beam incident upon said mask through said first localized light transmitting area and one first-order diffracted beam produced from said pattern by the irradiation of a second illuminating beam incident upon said mask through said second localized light transmitting area are directed to said substrate through a first optical path of said projection optical system, and another first-order diffracted beam produced from said pattern by the irradiation of said first illuminating beam and another 0-order diffracted beam produced from said pattern by the irradiation of said second illuminating beam are directed to said substrate through a second optical path of said projection optical system, said first and second paths being respectively spaced by substantially an equal distance from the optical axis of said projection optical system at the Fourier transform plane within said projection optical system.

4. An exposure apparatus according to claim 1, wherein said aperture member includes 2n localized light transmitting areas (where n is a natural number).

5. An exposure apparatus according to claim 4, wherein said aperture member includes four localized light transmitting areas.

6. An exposure apparatus according to claim 1, wherein said illumination optical system comprises an optical integrator, and wherein said aperture member is arranged at a position near an exit end of said optical integrator.

7. An exposure apparatus according to claim 1, wherein any portion of said aperture member other than said localized light transmitting areas is formed into a light shielding portion.

8. An exposure apparatus according to claim 1, wherein any portion of said aperture member other than said localized light transmitting areas is formed into a light attenuating portion.

9. An exposure apparatus according to claim 1, wherein the position of each of said light transmitting areas of said aperture member is selected such that a 0-order diffracted beam and one first-order diffracted beam respectively produced from at least a part of said pattern are separately passed apart by substantially an equal distance from the optical axis of said projection optical system at the Fourier transform plane within said projection optical system with respect to the pattern of said mask.

10. An exposure apparatus according to claim 1, further comprising a device to vary for adjusting or changing purposes at least one of the angular positions about said optical axis of said illumination optical system and the distance apart from said optical axis of said localized light transmitting areas of said aperture member in accordance with the pattern of said mask.

11. An exposure apparatus according to claim 10, wherein said aperture member comprises a light shielding or light attenuating plate element having at least a pair of localized light transmitting areas, and wherein said device includes a mechanism for replacing said plate element with another plate element having a localized light transmitting area at relatively different positions.

12. An exposure apparatus according to claim 10, wherein said aperture member comprises an electrooptical element whereby predetermined areas in at least a pair of arbitrary positions are respectively made transparent and opaque, and wherein said device includes an electric circuit for driving said electrooptical element to make said predetermined areas transparent and opaque, respectively.

13. An exposure apparatus according to claim 1, further comprising a limiting member whereby beams other than each of a 0-order diffracted beam and one first-order diffracted beam respectively produced from said pattern of the mask are prevented from reaching said substrate.

14. An exposure apparatus according to claim 1, wherein said mask comprises two sets of periodic pattern arranged in perpendicular directions with respect to each other, and wherein said aperture member includes a first pair of two localized light transmitting areas arranged along the periodic direction of one of said sets and a second pair of two localized light transmitting areas arranged along the periodic direction of the other of said sets.

15. An exposure apparatus for projecting a pattern formed on a mask onto a substrate, said apparatus comprising:

an illumination optical system for irradiating an illuminating light from a light source on said mask, a projection optical system for projecting an image of said pattern onto said substrate, and an optical member, located between said mask and said light source within said illumination optical system that produces said light, for distributing the light intensity of said illuminating light at the Fourier transform plane within said illumination optical system with respect to said pattern of said mask or position near thereto such that said light intensity becomes higher in each of at least two localized areas spaced from the optical axis of said illumination optical system than portions of said optical member surrounding said two localized areas, whereby centers of said localized areas are spaced from each other by a distance selected in accordance with a fineness of said pattern of said mask, such that one component of a first beam from a first one of said areas passes through said projection optical system along substantially a same path as one component of a second beam from a second one of said areas, and such that another component of said first beam passes through said projection optical system along substantially a same path as another component of said second beam.

16. An exposure apparatus according to claim 15, wherein said illumination optical system includes an optical element whereby the illuminating light beams from said two localized areas are substantially symmetrically inclined on said mask.

17. An exposure apparatus according to claim 15, further comprising a limiting member whereby beams other than each of a 0-order diffracted beam and one first-order diffracted beam respectively produced from said pattern of the mask are prevented from reaching said substrate.

18. An exposure apparatus comprising:

a light source;

a light condensing optical system having an optical axis and condensing light from said light source and applying the condensed light to a mask having a pattern;

a projection optical system for projecting an image of said pattern illuminated by said condensed light onto a substrate; and an aperture member interposed between said light source and said mask and having at least two separate light transmitting areas, each area being spaced from said optical axis of said light condensing optical system by a distance selected in accordance with the fineness of said pattern, such that one component of a first beam from a first one of said areas passes through said projection optical system along substantially a same path as one component of a second beam from a second one of said areas, and such that another component of said first beam passes through said projection optical system along substantially a same path as another component of said second beam.

19. An exposure apparatus according to claim 18, further comprising a fly-eye lens interposed between said light source and said light condensing optical system, said aperture member being arranged at a position near an exit end of said fly-eye lens.

* * * * *